United States Patent [19]

Golda et al.

[11] Patent Number: 4,576,892

[45] Date of Patent: Mar. 18, 1986

[54] PHOTOSENSITIVE MATERIALS

[75] Inventors: Eugene Golda, Monsey; Alan Wilkes, Brewster, both of N.Y.

[73] Assignee: Polychrome Corporation, Yonkers, N.Y.

[21] Appl. No.: 710,827

[22] Filed: Mar. 12, 1985

Related U.S. Application Data

[63] Continuation of Ser. No. 510,456, Jul. 1, 1983, abandoned, which is a continuation of Ser. No. 388,046, Jun. 14, 1983, abandoned, which is a continuation of Ser. No. 173,229, Jul. 28, 1980, abandoned.

[51] Int. Cl.⁴ .......................... G03F 7/08; G03C 5/18
[52] U.S. Cl. .................... 430/157; 430/154; 430/163; 430/168; 430/302; 430/309; 430/327; 430/494; 430/945; 430/942
[58] Field of Search .............. 430/157, 163, 327, 302, 430/309, 168, 945, 154, 494, 942

[56] References Cited

U.S. PATENT DOCUMENTS

| 2,908,572 | 10/1959 | Schoen | 430/152 |
| 3,144,331 | 8/1964 | Thommes et al. | 430/327 |
| 3,598,584 | 8/1971 | Rust et al. | 430/327 |
| 3,615,442 | 10/1971 | Geris et al. | 430/327 |
| 3,859,091 | 1/1975 | Wessells et al. | 430/327 |
| 4,063,949 | 12/1980 | Uhlig et al. | 430/945 |
| 4,212,935 | 1/1975 | Conavello | 430/327 |

FOREIGN PATENT DOCUMENTS 956337 4/1964 United Kingdom ............... 430/152

Primary Examiner—Charles L. Bowers, Jr.

[57] ABSTRACT

A presensitized plate adapted for use in lithography comprising a support member with a metal surface, e.g. aluminum metal, and overlying layer containing a diazo compound. In accordance with this invention, the relative exposure sensitivity of the diazo compound is improved by pretreatment to accelerate its reactivity in the presence of actinic light. One method of pretreatment involves preheating the diazo compound to a temperature above about 35° C. up to about 120° C. The improved lithographic plate and the process of preparing plate are claimed.

15 Claims, No Drawings

PHOTOSENSITIVE MATERIALS

This application is a continuation of Ser. No. 510,456, filed July 1, 1983, now abandoned; which was a continuation of Ser. No. 388,046, filed June 14, 1982, now abandoned; which in turn was a continuation of Ser. No. 173,229, filed July 28, 1980, now abandoned.

The present invention relates to an improved lithographic plate for projection exposures. More particularly the invention pertains to a lithographic plate comprising a support member having a metal surface and an overlying coating containing a diazo compound which has been pretreated to accelerate its reactivity in the presence of light.

BACKGROUND OF THE INVENTION

As is well known in the lithographic art, a support material such as a protectively coated metal plate is coated with a sensitizer or photosensitive layer containing a diazo compound. When the resulting photosensitized plate is exposed to a suitable light source through a transparency or a means for selective transmission of such light, image and nonimage areas are formed. Thereafter the plate is developed to provide oleophilic ink-receiving areas and hydrophilic water-receiving areas, so that it can be used in a lithographic press.

One disadvantage of the commercially available lithographic printing plates is that they do not have the relatively high exposure sensitivity required to either effectively or economically produce an image by projection exposure on such printing plates. Moreover, any image so produced will be lost after several hundred or less impressions.

One object of the present invention is to overcome the disadvantages discussed above, thereby permitting effective use of projection exposure to image lithographic printing plates having an overlying layer, containing a diazo compound without deleteriously affecting the other desirable characteristics of the printing plate.

SUMMARY OF THE INVENTION

This invention pertains to the discovery of how to modify the diazo compound in the lithographic printing plate to improve its relative exposure sensitivity, which in turn permits durable image formation with a conventional projection exposure.

An essential feature of the present discovery was the finding that a relationship existed between the relative exposure sensitivity of a diazo compound and its degree of decomposition. More specifically, the diazo compound is modified to accelerate its reactivity characteristics in the presence of actinic light.

The degree of decomposition in order for the diazo compound to attain the desired improvement in its relative exposure sensitivity can be determined as well as controlled by spectrophotometric analysis. It has been found, for example, that for certain purposes of this invention the controlling point is based on the relative spectrophotometric peak ratio measured at 375 and 650 nm.

DETAILED DESCRIPTION OF THE INVENTION

A lithographic printing plate according to the present invention comprising a metallic sheet or plate at least one surface of which is coated with an exposure sensitive layer containing a diazo compound that has been modified to accelerate its reactivity characteristics in the presence of a light source emanating from a projection exposure.

Conventional support members may be employed in the practice of this invention. The preferred supports may be any of the standard metal or metal surfaced plates which are commonly used in lithographic printing. Aluminum and zinc are two of the most preferred plates. It will be understood that the plates may be specially treated or be provided with intermediate coating or barrier layers well known to the art. In the case of aluminum, for example, it is often advantageous to chemically or electrically anodize its surface. The metal surface can also be silicated.

The light-sensitive diazo compound used in this invention may be those known in the art. A method of preparing a very satisfactory diazo compound is described in U.S. Pat. No. 2,679,498 and in U.S. Pat. No. 2,063,631. This compound is a condensation product of paraformaldehyde with p-diazo-diphenylamine sulfate. Diazo compounds are also described in U.S. Pat. No. 2,667,415 which together with the previously mentioned patents and the diazos disclosed thereby are hereby incorporated by reference. Upon exposure to light, such as ultra-violet light, the light-sensitive diazo compounds expel nitrogen from the molecule and form a water-insoluble, hydrophobic and oleophilic material which then becomes the printing image. The unexposed portions of the compound are readily washed away by known developer solutions. Additional examples of suitable diazo compounds are described in U.S. Pat. Nos. 2,692,827; 2,714,066; 2,773,779; 2,778,735; 2,958,599; and 3,030,210. Illustrative diazo compounds are as follows:

p-diazo-diphenylamine
4-diazo-e-methoxy-diphenylamine
4-diazo-2,5-dimethoxy-4'-methyl-diphenylsulfide
4-diazo-2,5-diethoxy-4'-methyl-diphenylsulfide
4-diazo-diphenylether, etc.

The diazo compound may be stabilized by known methods which include reacting the diazo compound with sulfonic acid or derivatives; condensing the diazo with an aldehyde such as formaldehyde; complexing the diazo with metal salts such as zinc halide or borofluorides, stannic chloride, sodium chloride, aluminum chloride, etc.

The diazo compound in the form of a dispersion or solution may be applied to the support member by dipping, spraying, roller coating, brushing, or other conventional techniques.

As previously noted, the essential feature of the present invention is to pretreat the diazo compound or derivatives thereof prior to exposure and, preferably, prior to coating it on the support in such a manner that its relative high exposure sensitivity is improved to the extent that it can effectively as well as economically be used to image a printing plate by means of a projection exposure.

The pretreatment of the diazo compound is such that its reactivity characteristics in the presence of light is accelerated. Preheating of the diazo compound or a derivative thereof is one of the preferred methods of improving its relative exposure sensitivity. In general, the heating may be carried out at a temperature in excess of 30° C., preferably within the range of about 60° to 120° C. The heating period will vary, of course, depending upon the temperature employed. The time period will be from about 1 to 150 hours, generally from 2 to 60 hours, and preferably from about 4 to 40 hours. In the preferred practice of this invention the diazo compound, in the form of a solution or dispersion, is heated prior to being coated on the metallic plate. It is possible, however, to carry out the heating step after the diazo or its derivative has been applied to the plate.

As noted above, the degree of decomposition which is to be achieved in order to enhance the relative exposure sensitivity of the diazo component can be controlled by spectrophotometric analysis. The controlling point being based on the relative spectrophotometric peak ratio measured at 375 and 650 nm. The degree of decomposition is measured by the 650 nm absorbance region. The ranges for a 1% solution in methyl cellosolve is as follows:

| Pre-Treatment Conditions | Absorbance, 650 nm |
| --- | --- |
| Unheated diazo | 0.20 |
| 60° C. - 8 hours | 0.43 |
| 60° C. - 20 hours | 0.46 |
| 60° C. - 40 hours | 1.20 |
| 70° C. - 4 hours | 0.56 |
| 70° C. - 8 hours | 0.97 |
| 70° C. - 20 hours | 1.80 |

The optimum range for plate performance is reflected above by absorbance values of 0.90–2.00. At 375 nm, also a 1% solution in methyl cellosolve, the optimum absorbance value range is 0.40–0.80, preferably 0.69–0.79.

Although the preferred method of activating the diazo component involves a separate heating step, which is illustrated below in greater detail, other pretreatments which will accelerate its decomposition may also be satisfactorily employed. Thus, for example, the pretreatment of the diazo compound may be carried out with ultra-violet rays, laser beams, electron beam, deep ultra violet (less than 300 nm) and x-rays.

Although the exact mechanism involved in accelerating the reactivity characteristics of the diazo compound or derivative is not fully understood, it is believed that the diazo compounds couple during the pretreatment to produce active azo polymers. These azo polymers appear to be inherently more responsive to ultra-violet radiation during the exposure of the images.

The lithographic plate product can be employed in projection imaging units used by large form and linework printing companies where high volume, offset printing plates are used on a regular basis. As will be appreciated by those skilled in the art, normal presensitized printing plates of standard ultra-violet responsiveness require long exposure times in the 35 mm, 8½×enlargement, projection mode of approximately 30–60 seconds. This results in low volume capacities of plate production as well as inadequate cost savings for this printing concept. Using presensitized plates with improved sensitivities, as in the present invention, the exposure time levels are reduced to 3–8 seconds. The commercial attractiveness of the microfilm projection system is thereby enhanced. In addition, increased plate making capabilities and adequate cost savings over the conventional system are achieved.

The invention will be more fully understood by reference to the following illustrative embodiments.

EXAMPLE 1

A conventional coating solution was prepared from the following ingredients:

| Base Coating Solution | Parts by Wt. |
| --- | --- |
| Epon 1007 Resin | 5.0 |
| Polyurethane Resin | 4.0 |
| $H_3PO_4$ | 0.02 |
| Basic Blue Dye | 0.20 |
| Ethylene Dichloride | 43.0 |
| Methanol | 30.0 |
| Methyl Cellosolve | 19.08 |

Epon 1007F is a trademarked product of Shell Chemical Co. and are phenoxy resins, i.e., polyhydroxy ethers as described in U.S. Pat. No. 3,091,533, the disclosure of which is incorporated herein by reference. The polyurethane resin which may be employed herein is commercially available as DV-532, from Polychrome Corp. It will be further understood that none of the above ingredients are critical for the present invention and that they may be substituted with equivalent materials well known in the art.

Diazo Component

A photosensitive component was prepared by reacting 1 gram of p-diazodiphenylamine condensation product of formaldehyde with 1.2 grams of 2-ethoxy, 4 methoxy-benzophenone-5 sulfonic acid by dissolving both compounds as a 5% solution in distilled water, stirring for 10 minutes, and filtering the reactants as water insoluble by products.

Run A

One half of the above obtained Base Coating Solution was admixed with 1 part by weight of the diazo photosensitive component, prepared as described above, to form Coating Solution A.

Run B

One half of the above obtained Base Coating Solution was admixed with 1 part by weight of the diazo photosensitive component, which had been pretreated by heating separately in a dry air oven at 60° C. for 30 hours, to form Coating Solution B.

Coating Solutions A and B were separately coated on lithographically suitable aluminum metal substrates which were pumice grained, anodized in sulphuric acid with DC current, and then further treated with a 5% sodium silicate solution for 2 minutes at 180° F.

The resulting lithographic plates were exposed at 6 times magnification for 10 seconds on the Projection Exposure Unit which is a 1 kilowatt, mercury ultra-violet light source.

The plate with Coating Solution A gave a GATF 21 Sensitivity Guide reading of a Solid 1, Tail 3 which indicates inadequate exposure. In contrast, the plate with Coating Solution B resulted in a reading of Solid 4, Tail 8 which indicates an acceptable exposure. Moreover, when the two plates were placed on an offset printing press the plate with Coating Solution A showed an image area walf-off after only 200 impressions. The plate with Coating Solution B ran 10,000 acceptable impressions.

EXAMPLE 2

The photosensitive diazo component prepared in accordance with the procedures set forth in Example 1 was subjected to a metal halide ultra-violet energy source for a total radiant energy level ranging from 2–16 mJ/cm².

The procedure of Example 1, Run B was then followed except that an equivalent amount of the ultraviolet pretreated diazo component prepared above was substituted for the heat treated diazo component. The image test results obtained with the coating solution of this Example 2 were comparable to those obtained in Example 1, Run B.

EXAMPLE 3

The photosensitive diazo component prepared in accordance with the procedures set forth in Example 1 was subjected to an electron beam energy source of 25 KV acceleration voltage, $10^{-8}$ amp beam current at a scanning time of 0.2–2.0 seconds for a 10×10 mm area of sample. This resulted in an absorbance value at 650 nm of from 0.9 to 1.8 when subjected to spectrophotometric analysis.

The procedures of Example 1, Run B were then followed, except that an equivalent amount of the electron-beam pretreated diazo component prepared above was substituted for the heat treated diazo component. The image test results obtained with the coating solution of this Example 2 were comparable to those obtained in Example 1, Run B.

EXAMPLE 4

The procedures of Example 1 were followed except that 1 gram of 4-diazo-2,5-diethoxy-4'-methyl diphenylsulphide condensation product of formaldehyde was reacted with 1.4 grams of toluene sulfonic acid to obtain the Diazo Photosensitive Component. When this Diazo Photosensitive Component was treated in accordance with Example 1, Run B, similar results were obtained.

EXAMPLE 5

The procedures of Example 1 were followed except that the following Base Coating Solution #2 was prepared and employed therein:

| Base Coating Solution #2 | Parts by Wt. |
|---|---|
| Polyurethane Resin (available as Estane 5715 from B.F. Goodrich Co.) | 2.0 |
| Polyurethane Resin (available as DV-530 from Polychrome Corp.) | 5.0 |
| Orasol Blue GN Dye (available from Ciba-Geigy Co.) | 0.3 |
| Methyl cellosolve | 98.0 |

The results obtained were equivalent to those obtained in Example 1.

EXAMPLE 6

The procedure of Example 1, Run B were followed except that the energy sources employed to pretreat the diazo component were an argon laser and deep UV emission source of less than 300 nm with like satisfactory results being obtained.

Although the embodiments shown above illustrate certain aspects of the present invention, it will be understood that the coating and diazo components as well as the diazo pretreatment may vary in accordance with the broader teachings of this invention.

What is claimed is:

1. In a presensitized plate, for use in lithography, having a support member with a metal surface and an overlying layer on said metal surface, said layer comprises a photosensitive composition further comprising a diazo compound relative to light, the improvement which comprises employing a diazo compound which has been subjected to treatment prior to preparation of the photosensitive composition, prior to being coated on said metal surface, and prior to imagewise exposure for a time period sufficient to accelerate its light reactivity characteristics thereby improving its relative exposure sensitivity, said treated diazo compound having an absorbance at 375 nm of 0.40–0.79 and at 650 nm of 0.90–2.0, and wherein said treatment comprises (a) heating said diazo compound to a temperature above about 35° C. up to about 120° C., (b) ultraviolet light, (c) laser beam, or (d) electron beam.

2. In the lithographic plate of claim 1 wherein said treatment comprises heating said diazo compound to a temperature above about 35° C. up to about 120° C. for a time period sufficient to accelerate its light reactivity characteristics.

3. In the lithographic plate of claim 2 wherein the period of heating ranges from about 1 to about 150 hours.

4. In the lithographic plate of claim 1 wherein said treatment comprises treatment of the diazo compound with ultra-violet light.

5. In the lithographic plate of claim 1 wherein said treatment comprises treatment of the diazo compound with a laser beam.

6. In the lithographic plate of claim 1 wherein said treatment comprises treatment of the diazo compound with an electron beam.

7. In a presensitized plate for use in lithography, having a support member with an aluminum surface and an overlying layer on said aluminum surface, said layer comprising a photosensitive composition further comprising a diazo compound reactive to light to define printing and non-printing areas, the improvement which comprises heating said diazo compound, prior to preparation of the photosensitive composition, prior to being coated on said aluminum surface, and prior to imagewise exposure, to a temperature of from above about 35° C. up to about 120° C. for about 1 to about 150 hours whereby the light reactivity characteristic of the diazo compound has been accelerated thereby improving its relative exposure sensitivity, said treated diazo compound having an absorbance at 375 nm of 0.40–0.79 and at 650 nm of 0.90–2.0.

8. In the lithographic plate of claim 7 wherein the diazo compound is a salt of the condensation product of formaldehyde with p-diazodiphenylamine.

9. In the lithographic plate of claim 7 wherein the diazo compound is a salt of the condensation product of formaldehyde with 4'-diazo-p-methoxydiphenylamine.

10. In the lithographic plate of claim 7 wherein the diazo compound is a salt of the condensation product of formaldehyde with 4-diazo-2,5-dimethoxy-4'-methyldiphenylsulfide.

11. In a process for preparing a presensitized plate, for use in lithography, by applying to a support member with a metal surface an overlying coating of a photosensitive composition comprising a diazo compound reactive to light to define printing and non-printing area, the improvement which comprises subjecting the diazo compound to treatment prior to preparation of the photosensitive composition, prior to being coated on said metal surface, and prior to imagewise exposure to accelerate its reactivity in the presence of light thereby improving its relative exposure sensitivity, said treated diazo compound having an absorbance at 375 nm of 0.40–0.79 and at 650 nm of 0.90–2.0, and wherein said treatment comprising (a) heating said diazo compound to a temperature above about 35° C. up to about 120° C., (b) ultraviolet light, (c) laser beam, or (d) electron beam.

12. In the process of claim 11 wherein said support metal surface is aluminum.

13. In the process of claim 11 wherein the treatment comprises heating the diazo compound to a temperature of above about 35° C. up to about 120° C., for a period of time sufficient to accelerate its light reactivity characteristics.

14. In the process of claim 13 wherein the period of heating ranges from about 1 to about 150 hours.

15. A method of accelerating the reactivity of a photosensitive diazo compound and improving its relative exposure sensitivity to light which comprises heating said diazo compound to a temperature of from above about 35° C. to about 120° C., for about 1 to about 150 hours prior to exposing said diazo compoud to light, prior to formulating a photosensitive composition with said diazo compound, and prior to coating said diazo compound on a metal substrate, said heating diazo compound having an absorbance at 375 nm of 0.40–0.79 and at 650 nm of 0.90–2.0.

* * * * *